United States Patent
Pietsch et al.

(10) Patent No.: US 7,872,763 B2
(45) Date of Patent: Jan. 18, 2011

(54) DEVICE FOR MEASURING THE POSITION OF AT LEAST ONE STRUCTURE ON A SUBSTRATE

(75) Inventors: Katrin Pietsch, Solms (DE); Klaus-Dieter Adam, Jena (DE); Tillmann Ehrenberg, Schoeffengrund (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 266 days.

(21) Appl. No.: 12/286,466

(22) Filed: Sep. 30, 2008

(65) Prior Publication Data

US 2009/0128828 A1    May 21, 2009

(30) Foreign Application Priority Data

Nov. 15, 2007   (DE) .................. 10 2007 000 991

(51) Int. Cl.
*G01B 11/02*   (2006.01)
*G01N 21/01*   (2006.01)

(52) U.S. Cl. ...................... 356/500; 356/244

(58) Field of Classification Search ............... 356/244, 356/498, 500

See application file for complete search history.

(56) References Cited

U.S. PATENT DOCUMENTS

| | | | | |
|---|---|---|---|---|
| 5,909,276 A | * | 6/1999 | Kinney et al. | 356/237.2 |
| 5,999,254 A | * | 12/1999 | Seibert et al. | 356/244 |
| 6,347,458 B1 | * | 2/2002 | Kaczynski | 33/503 |
| 6,816,253 B1 | * | 11/2004 | Blaesing-Bangert et al. | 356/244 |

FOREIGN PATENT DOCUMENTS

| | | |
|---|---|---|
| DE | 19858428 C2 | 7/2000 |
| DE | 199 49 019 C2 | 5/2001 |
| DE | 10031719 A1 | 1/2002 |
| DE | 10047211 B4 | 5/2002 |

OTHER PUBLICATIONS

Bläsing, Dr. Carola, "Pattern Placement Metrology for Mask Making," Semicon Conference, Education Program, Geneva, Mar. 31, 1998.

* cited by examiner

*Primary Examiner*—Michael A Lyons
(74) *Attorney, Agent, or Firm*—Simpson & Simpson, PLLC

(57) ABSTRACT

A device for measuring the position of at least one structure on a substrate is disclosed. The substrate to be measured is positioned in a mirror body. A flat insert is provided in the mirror body and is formed such that the substrate and the insert together always have the same optical thickness, irrespective of the mechanical thickness of the substrate.

6 Claims, 4 Drawing Sheets

DEVICE FOR MEASURING THE POSITION OF AT LEAST ONE STRUCTURE ON A SUBSTRATE

CROSS REFERENCE TO RELATED APPLICATIONS

This patent application claims priority of German Patent Application No. 10 2007 000 991.9, filed on Nov. 15, 2007, the application is incorporated herein by reference.

FIELD OF THE INVENTION

The present invention relates to a device for measuring the position of at least one structure on a substrate. There is provided a measurement table movable in the X-coordinate direction and in the Y-coordinate direction. A mirror body, in which the substrate is arranged, is provided on the measurement table.

BACKGROUND OF THE INVENTION

A coordinate measuring device is well-known from prior art. See, for example, the lecture script "Pattern Placement Metrology for Mask Making" by Dr. Carola Bläsing. The lecture was given on the occasion of the Semicon conference, Education Program, in Geneva on Mar. 31, 1998, and describes the coordinate measuring machine in detail. The structure of a coordinate measuring machine, as it is known, for example, from prior art, will be explained in more detail in the following description associated with FIG. 1. A method and a measuring device for determining the position of structures on a substrate is known from German published application DE 100 47 211 A1. For details on the mentioned position determination, see that document.

German patent document DE 199 49 019 C2 discloses a measuring device for measuring structures on substrates varying in thickness. The substrates are inserted in an X/Y slide. The X/Y slide comprises a peripheral rim. The measuring device itself is equipped with illumination optics, wherein there are provided several compensation elements needed for compensating the optical path length. These compensation elements are selected corresponding to the substrate to be measured. The compensation elements are located in storage compartments on the peripheral rim of the recess of the X/Y slide. Depending on which compensation element is needed, they are removed from the storage compartment by means of the illumination optics. In this way, an equal optical thickness of the whole system consisting of compensation element and substrate is achieved irrespective of the mechanical thickness of the substrate used. One disadvantage is that the compensation elements merely rest on the illumination optics and may thus constitute a further error source, which may result in faulty measurements with the measuring device.

Document DE 100 31 719 discloses an illumination means having a light source, an optical fiber bundle, a coupling-in optical system upstream of and a coupling-out optical system downstream of the fiber bundle, and an illuminating optical system. A homogenizing optical system between the coupling-out optical system and the illuminating optical system effects a homogenization of the intensity distribution in the image field. The homogenizing optical system consists of a microhoneycomb condenser and a lens member, which superimpose the exit opening of the fiber bundle in an intermediate image plane to form a homogeneous intermediate image. The coordinate measuring device itself includes an X/Y measurement table to receive a substrate having a structure to be measured, and the illumination system mentioned above.

Document DE 198 58 428 discloses a movable x/y measurement table having two measurement mirrors, which are arranged to be orthogonal to each other, for interferometric position determination. The movable measurement table, a mirror body carrying the measurement mirrors, and the receptacle for the substrate (9) are implemented as separate elements.

SUMMARY OF THE INVENTION

It is the object of the invention to provide a device allowing to achieve the same optical thickness for all substrates and to eliminate potential error sources involved in achieving the same optical thickness.

This object is achieved by a device comprising a measurement table movable in a X-coordinate direction and in a Y-coordinate direction; a mirror body provided with the measurement table in which the substrate is positioned; at least one flat insert provided in the mirror body, wherein the flat insert is formed such that the substrate and the insert together always have the same optical thickness, irrespective of the mechanical thickness of the substrate, and that the size of the insert is at least such that, in projection on the substrate, the insert covers at least the whole area of the substrate.

It is advantageous if at least one flat insert may be inserted in the mirror body. The insert is formed such that the substrate and the insert together always have the same optical thickness, irrespective of the mechanical thickness of the substrate.

The size of the insert is at least such that, in projection on the substrate, it covers at least the area of the substrate.

The device is a coordinate measuring machine provided in a housing at least with a storage for several inserts and for several substrates. The inserts differ in optical thickness.

Inside the housing, a transport system is provided which, depending on the optical and/or mechanical thickness of the substrate currently to be measured, selects a corresponding insert and puts it into the mirror body. The substrates may be coded so that the device may select the required inserts automatically such that the same optical thickness is achieved for the combination of insert and substrate. Based on the measuring recipe to be completed, the system further knows which substrates and which type of substrate are used. With this information, the corresponding insert may be selected and positioned in the mirror body before the substrate is deposited in the mirror body.

The coordinate measuring machine comprises a transmitted light illumination means for the substrate. The transmitted light illumination means includes a condenser. The insert is inserted into the mirror body such that the insert is directly opposite to the condenser. The surface of the substrate carrying the structures faces the measurement objective of the coordinate measuring machine. The measurement objective itself is also opposite the condenser.

The coordinate measuring machine has a computer associated therewith, which, based on the code of the substrates, positions an insert in the mirror body by means of a transport system such that a predetermined optical thickness of substrate and insert is set.

At least one laser interferometer is associated with the mirror body so that the position of the measurement table in the X-coordinate direction and in the Y-coordinate direction may be determined with the help of the mirror body located on the measurement table.

In one embodiment, holding elements for the substrate may form the corners of a triangle. The holding elements are preferably formed to be point-like. It is particularly advantageous for the theoretical calculation of the deflection of the substrate if the holding elements are arranged on the corners of an isosceles triangle. Similarly, it is also contemplated that the point-like holding elements are arranged on the corners of an equilateral triangle.

BRIEF DESCRIPTION OF THE DRAWINGS

In the following, embodiments will explain the invention and its advantages in more detail with reference to the accompanying drawings, in which.

DETAILED DESCRIPTION OF THE INVENTION

Figure 1:
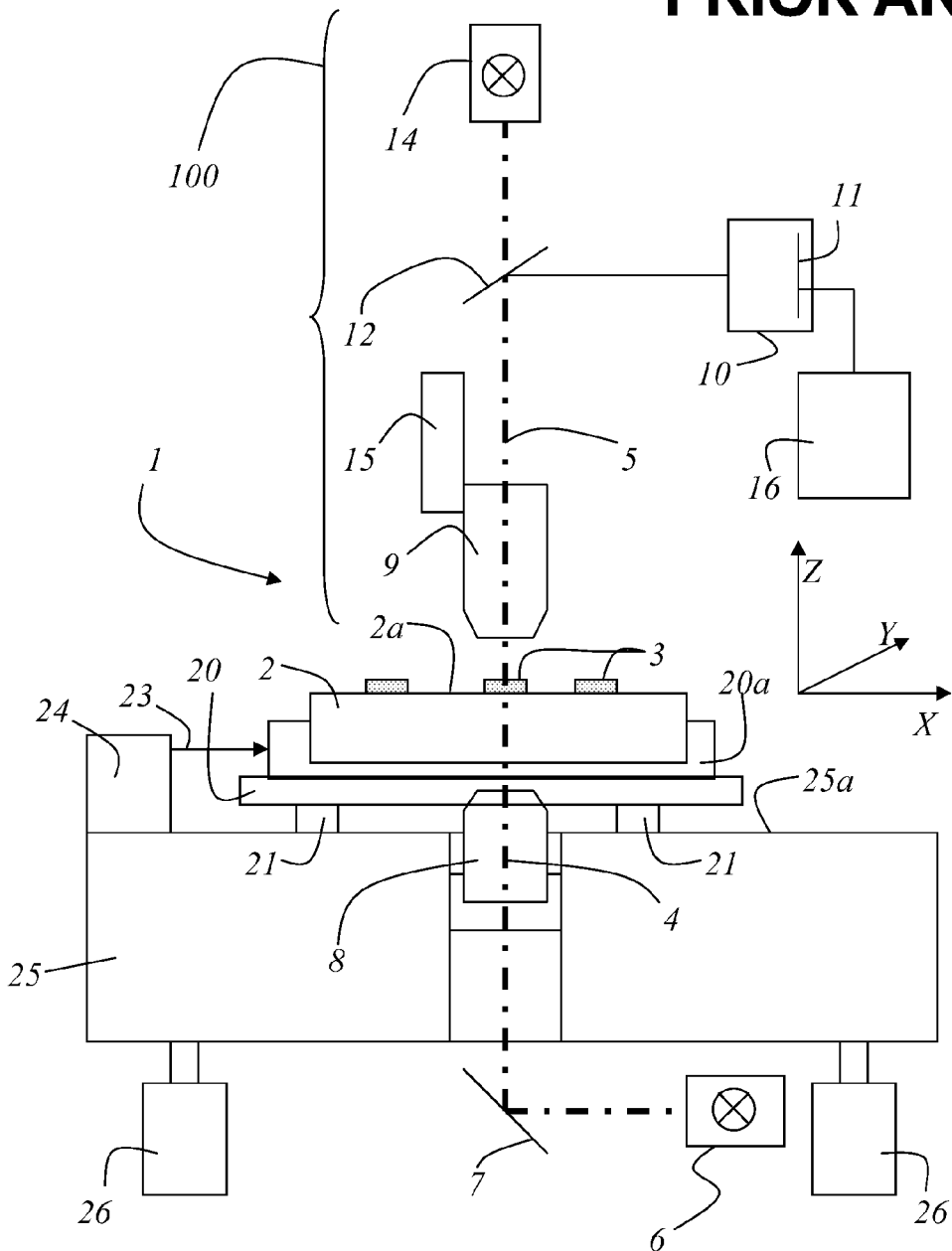
FIG. 1 schematically shows a prior art coordinate measuring machine.

Several coordinate measuring devices 1 of the type shown in FIG. 1 are known from prior art. For the sake of completeness, however, the operation and arrangement of the individual elements of the coordinate measuring device 1 will be described. The coordinate measuring device 1 includes a measurement table 20 positioned on bearings 21 (the bearings 21 may, for example, be implemented as air bearings) to be movable in the X-coordinate direction and in the Y-coordinate direction in a plane 25a. The plane 25a is formed of an element 25. In a preferred embodiment, the element 25 is granite. However, someone skilled in the art will understand that the element 25 may also be formed of any other material guaranteeing an exact plane 25a for translating the measurement table 20. The position of the measurement table 20 is measured by means of at least one laser interferometer 24 emitting a light beam 23 for the measurement. For this purpose, a mirror body 20a also carrying the substrate 2 to be measured is positioned on the measurement table. The element itself is positioned on vibration dampers 26 to thus keep building vibrations away from the measuring device.

A substrate 2 carrying the structures 3 to be measured is inserted in the mirror body 20a. The substrate 2 may be illuminated with a transmitted light illumination means 6 and/or an incident light illumination means 14. The light of the transmitted light illumination means 6 reaches the substrate 2 via a deflecting mirror 7 and a condenser 8. Similarly, the light of the incident light illumination means 14 reaches the substrate 2 via a measurement objective 9. The measurement objective 9 is provided with an adjusting means 15, which allows the adjustment of the measurement objective 9 in the Z-coordinate direction. The measurement objective 9 collects the light coming from the substrate 2 and directs it out of the incident light illumination axis 5 by means of a semi-transparent deflecting mirror 12 and directs it to a camera 10 provided with a detector 11. The detector 11 is connected to a computer system 16 generating digital images from the values measured by the detector 11.

It is also contemplated that the coordinate measuring machine 1 is designed such that a mask or a substrate 2 is inserted such that the surface 2a of the mask carrying the structures 3 faces in the direction of gravity. This arrangement is a so-called inverse set-up of a coordinate measuring machine 1. This has the advantage that the masks 2 in the coordinate measuring machine have the same orientation as when they are arranged in a stepper for exposing the masks on a wafer. In this context, see also FIG. 2, which describes the inverse set-up in detail.

Figure 2:
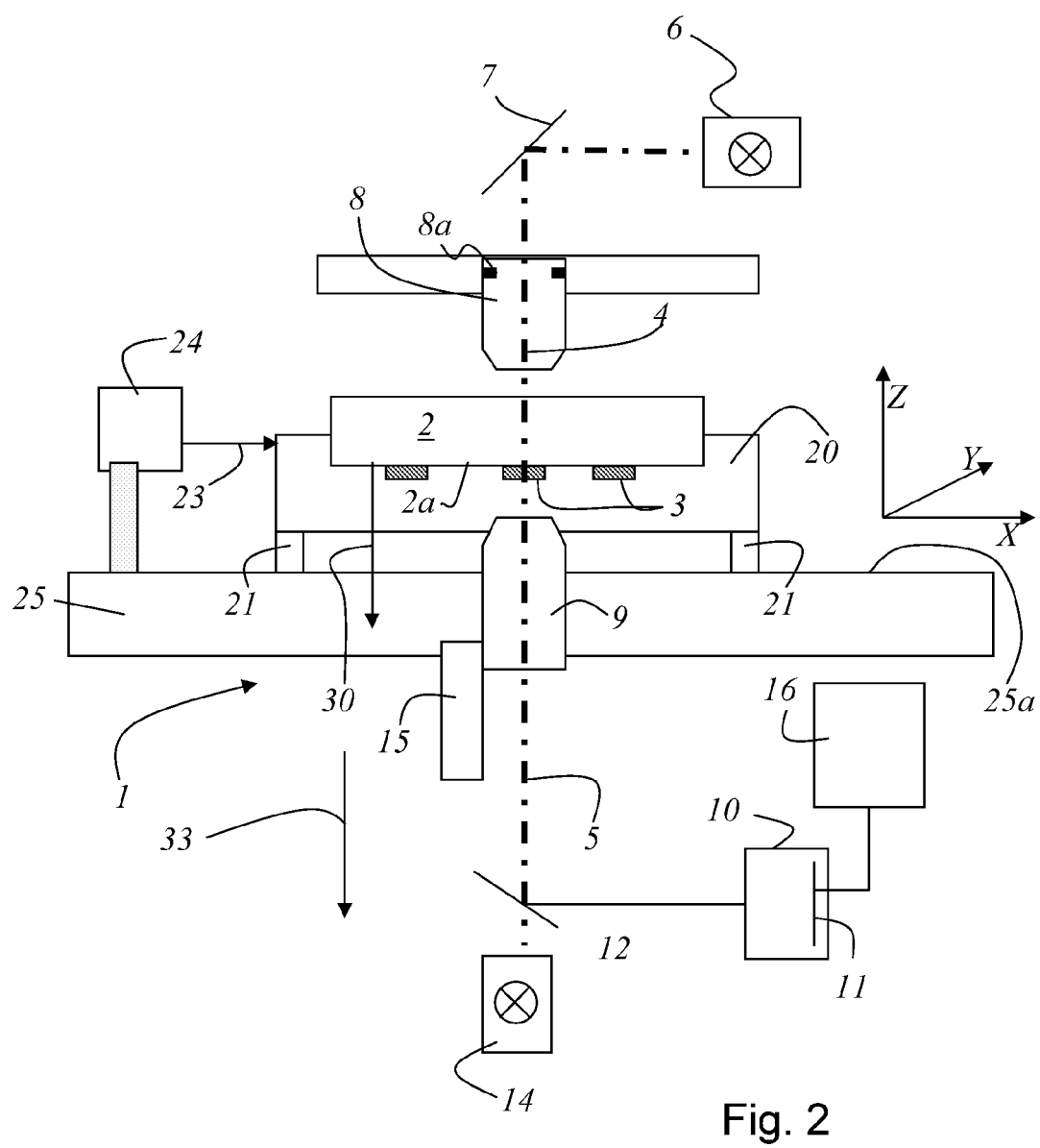
FIG. 2 schematically shows the inverse arrangement of a coordinate measuring machine.

The description of FIG. 2 uses the same reference numerals as in FIG. 1 for the same elements. FIG. 2 shows the coordinate measuring machine 1 having the inverse set-up. The substrate 2 carrying several structures 3 on a surface 2a is inserted in a measurement table 20. The position of the measurement table 20 is also measured by means of a laser beam 23 emitted by a laser interferometer 24. Illumination light for the transmitted light illumination of the substrate 2 may be introduced by an illumination means 6 via a deflecting mirror 7 or a light guide, if necessary. The illumination light propagates along the optical illumination path 4, which coincides with the optical axis of at least one measurement objective 9. The measurement objective 9 is arranged opposite to the structures 3 on the substrate 2. The illumination means 14 is provided for the incident light illumination of the structures 3. The terms "substrate" and "mask" for the semiconductor production are used as synonyms herein.

While the position of the structures 3 is measured and/or the structure widths of the structures 3 are determined, the substrate 2 is held in the coordinate measuring machine 1 such that the surface 2a carrying the structures 3 faces in the direction of the weight 30. In other words, a normal vector 30 with respect to the surface carrying the structures 3 is essentially parallel to the vector 33 of the weight.

Figure 3:
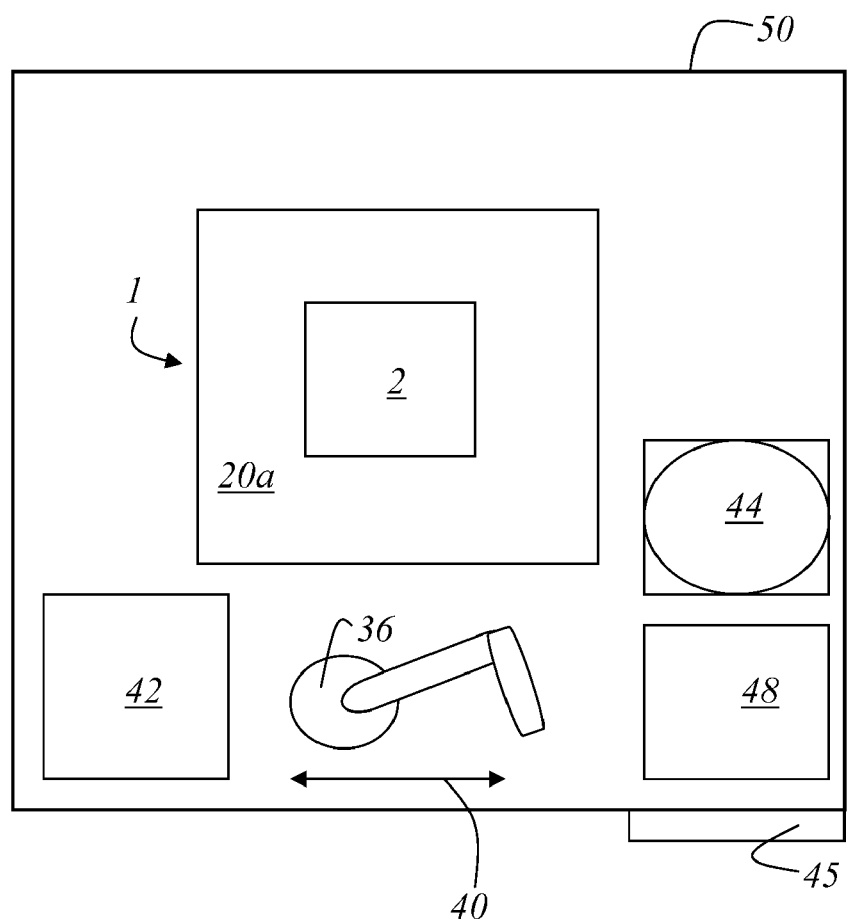
FIG. 3 shows a schematic top view of the arrangement of a coordinate measuring machine in connection with several depositing positions designed as accessory devices for the coordinate measuring machine.

FIG. 3 shows a schematic top view of the system for determining positions of structures on a substrate or a mask 2. The arrangement of the individual elements of the system inside the housing 50 is shown. The coordinate measuring device 1 is only schematically represented by the measurement table 20 (movable in the X-coordinate direction and/or Y-coordinate direction) and the substrate 2 positioned on the mirror body 20a. Inside the housing 50, which is designed as a climatic chamber, a magazine 42 may, for example, be arranged, in which the substrates 2 to be measured may, for example, be deposited for temperature adaptation. Similarly, the substrates 2 (masks for the semiconductor production) already measured may be deposited in the magazine 42 before they are output again via a loading aperture 45. The loading aperture 45 has a loading station 48 associated therewith, via which the substrates 2 may be introduced into the system or the housing 50. A transport means 46 capable of moving along the double arrow 40 is arranged between the loading station 48, the magazine 42 and the coordinate measuring machine 1. The transport means 46 allows transporting the substrates 2 to the stations or elements within the housing 50. Someone skilled in the art will understand that the loading apertures for the substrates 2 are designed to be closable. Obviously, the transport means 46 also serves to deposit the substrates 2 on the measurement table 20 or the mirror body 20a.

Figure 4:
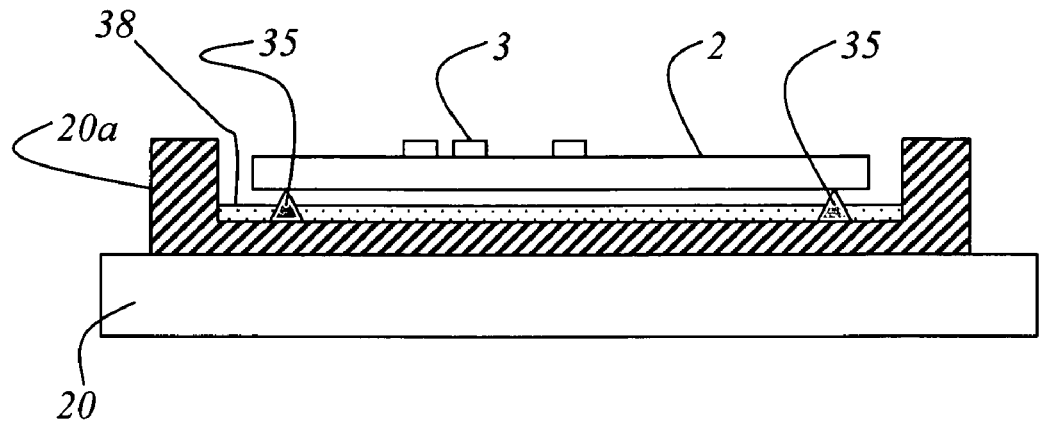
FIG. 4 shows a schematic side view of the positioning of a substrate in a mirror body provided on a table; and, FIG. 5 schematically shows a top view of a mirror body having three holding elements formed thereon, on which the substrate is resting.

FIG. 4 shows a schematic view of the mirror body 20a arranged on a measurement table 20. Several holding elements 35 are provided in the mirror body 20a, with the substrate 2 to be measured resting thereon. In the embodiment shown, the holding elements are arranged such that they contact the surface of the substrate 2 that does not carry any structures 3. The holding elements 35 for the substrate are designed such that they contact the substrate in a point-like way. Generally, ruby balls are used as holding elements 35 so that the substrate is seated on one point of the ball. An insert 38 is also provided in the mirror body 20a. The insert 38 is formed to have such a large area that it covers the whole surface of the substrate 2. In other words, the insert 38 is designed to be so large that, in projection on the substrate 2, it covers the whole area of the substrate 2. In the embodiment shown, the insert is designed such that it has an opening formed at the position of each holding element 35 so that the insert 38 is additionally guided by the holding elements 35. Someone skilled in the art will understand that the insert 38 may also have a different design. The insert design described in FIG. 4 is not meant to limit the invention in any way.

Figure 5:
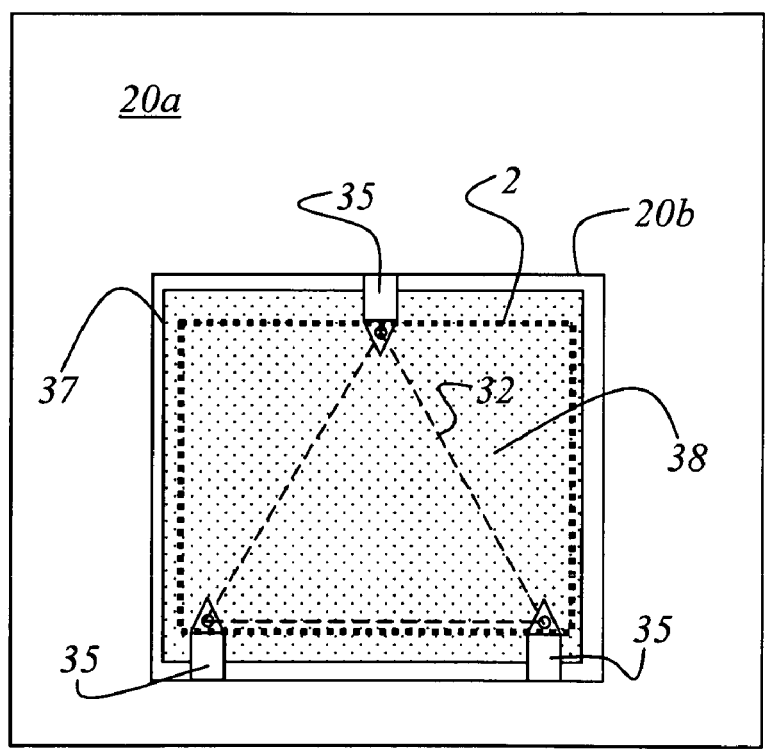

FIG. 5 shows a schematic top view of the mirror body 20a, in which the substrate is held by means of three holding elements 35. In the embodiment shown, the three holding elements are arranged on the corners of a triangle. Generally, the mirror body has a recess 20b formed therein, where the substrate is inserted. The mirror body 20a further comprises a recess 37 where the insert 38 may be deposited. In the embodiment shown, the recess 37 is formed to be somewhat larger than the substrate 2. Thus the area of the insert 38 is larger than that of the substrate 2. As described above, the coordinate measuring machine is arranged inside a housing 50. A plurality of storage elements is provided in the housing 50. Both the substrates 2 and the inserts 38 required for the various substrates 2 may be deposited in the storage elements. In a preferred embodiment, the housing 50 is implemented as a climatic chamber. This is required for the substrate 2 and/or the inserts 38 to reach a thermal equilibrium and a mechanical equilibrium. In the storage elements, the required relaxation processes may take place so that no changes in the equilibrium will affect the measured values obtained by the coordinate measuring machine 1. Thus the substrates and/or the inserts may be inserted into the mirror body 20a by means of the transport system 36.

The invention has been described with reference to a preferred embodiment of the invention. However, it is contemplated that modifications or changes may be made without departing from the scope of the following claims.

What is claimed is:

1. A device for measuring a position of at least one structure on a substrate, the device comprising:
   a measurement table movable in a X-coordinate direction and in a Y-coordinate direction;
   a mirror body arranged on the measurement table and in which the substrate is positioned; and,
   at least one flat insert arranged in the mirror body, wherein the flat insert has a size and is formed such that both the substrate and the insert together have the same optical thickness, irrespective of the mechanical thickness of the substrate, and the size of the insert is at least large enough such that the insert covers at least the whole area of the substrate, in projection on the substrate.

2. The device recited in claim 1, wherein the device is in the form of a coordinate measuring machine having a housing and at least one storage for a plurality of inserts and for a plurality of substrates, wherein the plurality of inserts have differing optical thicknesses.

3. The device recited in claim 2, including a transport system which is arranged to select a corresponding insert and place the corresponding insert into the mirror body, based upon the optical and/or mechanical thickness of the substrate.

4. The device recited in claim 2, wherein the coordinate measuring machine comprises a transmitted light illumination means for the substrate, the transmitted light illumination means including a condenser, wherein the insert in the mirror body is arranged directly opposite to the condenser, and a surface of the substrate carrying at least one structure faces a measurement objective of the coordinate measuring machine, and a measurement objective is arranged opposite the condenser.

5. The device recited in claim 4, including a computer arranged to position an insert in the mirror body by means of the transport system, based on a code of the substrate, such that a predetermined optical thickness of the substrate and the insert is set.

6. The device recited in claim 1, wherein at least one laser interferometer is associated with the mirror body such that a position of the measurement table in the X-coordinate direction and in the Y-coordinate direction is determinable by means of the mirror body.

* * * * *